United States Patent [19]
Hietala et al.

[11] Patent Number: 5,493,700
[45] Date of Patent: Feb. 20, 1996

[54] AUTOMATIC FREQUENCY CONTROL APPARATUS

[75] Inventors: Alexander W. Hietala, Cary; Duane C. Rabe, Hawthorn Woods, both of Ill.

[73] Assignee: Motorola, Schaumburg, Ill.

[21] Appl. No.: 144,940

[22] Filed: Oct. 29, 1993

[51] Int. Cl.[6] .................................................. H04B 1/40
[52] U.S. Cl. ................................................ 455/75; 455/76
[58] Field of Search .............................. 455/75, 76, 84, 455/86, 87; 331/25

[56] References Cited

U.S. PATENT DOCUMENTS

| | | | |
|---|---|---|---|
| 5,070,310 | 12/1991 | Hietala et al. | 455/76 |
| 5,093,632 | 3/1992 | Hietala et al. | 455/76 |
| 5,103,192 | 4/1992 | Sekine et al. | 455/76 |
| 5,111,162 | 5/1992 | Hietala et al. | 455/76 |
| 5,166,642 | 11/1992 | Hietala | 331/25 |
| 5,220,684 | 6/1993 | Suizu | 331/25 |
| 5,270,669 | 12/1993 | Jokura | 331/25 |

*Primary Examiner*—Reinhard J. Eisenzopf
*Assistant Examiner*—Mary M. Lin
*Attorney, Agent, or Firm*—Kirk W. Dailey

[57] ABSTRACT

The preferred embodiment of the present invention encompasses an automatic frequency control system implemented in a radiotelephone (101). The radiotelephone (101) includes a frequency synthesizer. The frequency synthesizer uses a division ratio varied with time by a multi accumulator fractional N synthesizer (140) such that the effective division ratio may be varied by non-integer steps. The division ratio is programmed to realize the desired channel frequency, the desired modulation waveform, and any automatic frequency correction offset. An accurate clock is provided to the control logic (104) and the user interface (105) sections of the radiotelephone (101) using a second multiple accumulator fractional N division system (139). This second fractional N division system (139) is programmed based on the automatic frequency control programming of the first fractional N synthesizer (140). This lower frequency may then be multiplied in a phase locked loop to provide an accurate reference at a second reference frequency.

10 Claims, 2 Drawing Sheets

AUTOMATIC FREQUENCY CONTROL APPARATUS

FIELD OF THE INVENTION

This invention relates to automatic frequency control (AFC) and more specifically to adjusting the frequency of an oscillator based on received data such that the frequency of oscillation is synchronized to an external reference.

BACKGROUND OF THE INVENTION

In the GSM (Global System for Mobile Communications) standard of digital cellular telephony a large number of mobile stations can communicate with a network of base stations. The mobile stations decode data from the base station network in digital form and, among many other functions, use this data to periodically adjust the master reference oscillator frequency of the mobile station.

Classically this adjustment of the master reference oscillator frequency has been performed by using a digital to analog converter to change the digital frequency correction data into analog form and then applying the resulting analog signal to a varactor diode to warp a crystal reference oscillator.

This method has several shortcomings. First of all the frequency correction data is already in digital form in the GSM system. It would be desirable to use the data in digital form and thus eliminate the digital to analog converter.

Secondly, using a varactor diode to warp a crystal results in a non-linear tuning characteristic. This requires a complex phasing algorithm to linearize the characteristic.

Finally, the practical limitations of the digital to analog converter resolution and the crystal oscillator component tolerances require a fairly large step size in the frequency tuning characteristic. In the GSM system this results in a step size of about 50 Hz. Since the frequency accuracy of GSM is required to be <100 Hz this can be a major problem.

A digital automatic frequency control system can be realized by the use of fractional N synthesis. Such a system is shown in U.S. Pat. No. 5,111,162, entitled "Digital Frequency Synthesizer having AFC and Modulation Applied to Frequency Divider" authored by Hietala et al. In this patent a secondary divider is used from the main oscillator output to derive a low frequency reference for offset synthesizers and logic circuitry. This secondary divider operates at the output frequency, thus, draws excessive current.

Therefore it would be advantageous to devise a digital automatic frequency control system which allows the digital automatic frequency control data to be used without conversion to analog form while providing a linear tuning characteristic with very fine minimum frequency step size and without drawing excessive current.

DESCRIPTION OF A PREFERRED EMBODIMENT

The preferred embodiment of the present invention encompasses a digital automatic frequency control system implemented in a radiotelephone. The radiotelephone includes a frequency synthesizer in which a variable oscillator output is fed to a digital divider. The division ratio of the digital divider is varied with time by a multi accumulator fractional N division system such that the effective division ratio may be varied by non-integer steps. The division ratio is then programmed to realize the desired channel frequency, the desired modulation waveform, and any automatic frequency correction offset. The output of the digital divider feeds one input of a phase comparison network. The other input of the phase comparison network is fed from a reference oscillator. The phase comparison network output is filtered to remove extraneous noise components and is then fed to the control input of the variable oscillator. The control input is such that the variable oscillator output frequency will adjust itself until it is equal to the reference oscillator frequency multiplied by the digital division ratio. This results in a digital automatic frequency correction input port with extremely fine resolution. Additionally, the reference oscillator does not need to be warped by a varactor diode in this situation, thus, the reference oscillator is a free running crystal oscillator with accuracy only approximating the expected reference frequency.

In the GSM system, the clock signal used to drive the logic sections of the radio is required to be synchronized to the radio frequency output signal. Therefore, the free running crystal oscillator cannot be used directly as the clock to the logic sections of the radio. An accurate clock is provided to the logic sections of the radio and to the reference inputs of any offset synthesizers of the radio by using a second multiple accumulator fractional N division system to divide the inaccurate reference oscillator frequency down to a fixed accurate frequency. This second fractional N division system is programmed based on the automatic frequency control programming of the first fractional N division system. This lower frequency may then be multiplied in a phase locked loop to provide an accurate reference at the originally desired reference frequency if necessary.

Figure 1:
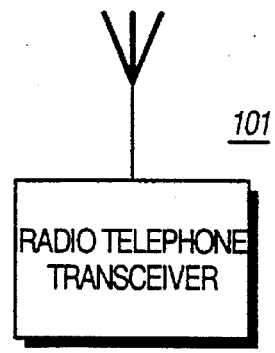
FIG. 1 is an illustration in block diagram form of a radiotelephone transceiver in accordance with the present invention.
Figure 2:
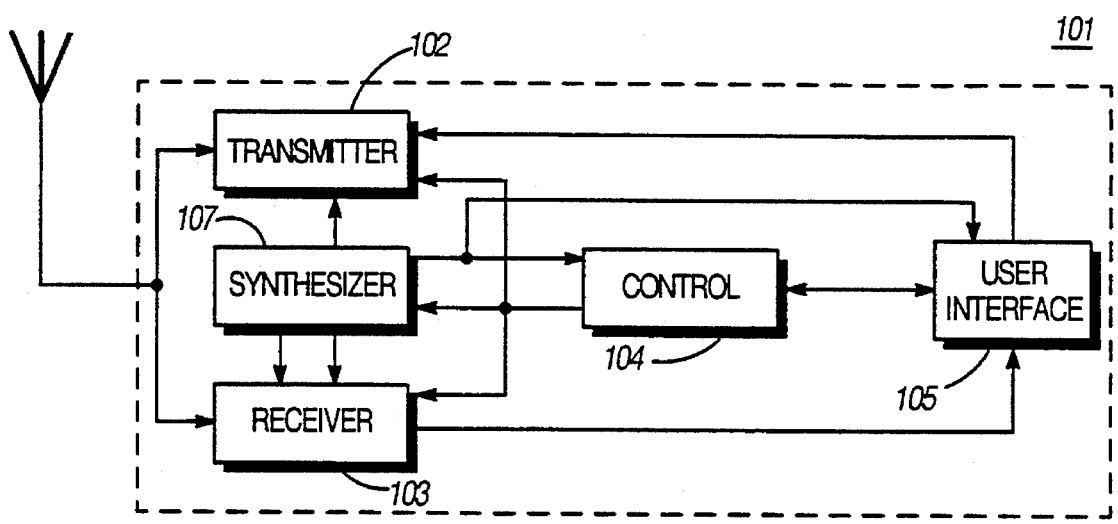
FIG. 2 is an illustration in block diagram form of a radiotelephone transceiver in accordance with the present invention.

FIG. 1 is an illustration in block diagram form of a radiotelephone 101. The radiotelephone 101 may be, but is not limited to be, a cellular radio telephone employing the GSM standard of operation. In FIG. 2 the radiotelephone 101 is shown to be composed of a transmitter 102, a receiver 103, a control logic 104, a user interface 105, and a synthesizer 107. The synthesizer 107 provides the receiver 103 and the transmitter 102 with signals, tuned to the proper frequency, to allow the reception and transmission of data from user interface 105. In addition the synthesizer 107 provides the user interface 105 and the control logic 104 with the necessary clock signal for proper operation of the logic circuits contained within these blocks. The user interface 105 typically includes a microphone, a speaker, a display and a keypad.

One of the functions of control logic 104 is to derive a digital signal from data received by receiver 103 to be used to adjust the frequency of synthesizer 107. This digital signal is known as automatic frequency control.

Figure 3:
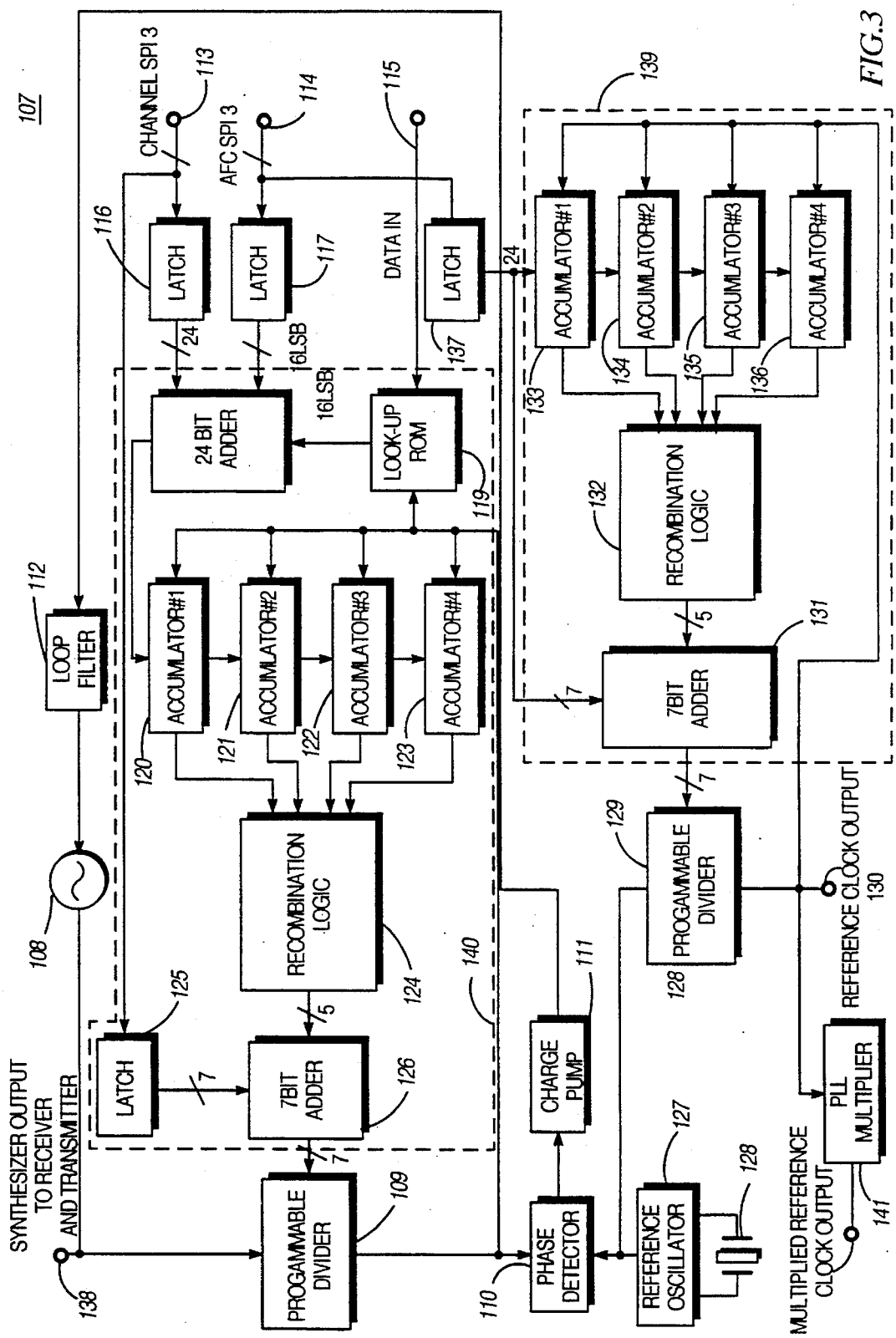
FIG. 3 is an illustration in block diagram form of a synthesizer section of a radiotelephone transceiver which is capable of performing the digital automatic frequency control in accordance with the present invention.

With reference to FIG. 3 the automatic frequency control signal is applied to data port 114 in a serially loaded form known as the serial programming interface (SPI) form. The serial data is loaded into latch 117 in which it is converted to parallel form and is then applied to adder 118. Two other inputs are applied to adder 118. The fractional part of the division to set the channel frequency is input to data port 113 in SPI form from control logic 104. This data is converted into parallel form by latch 116 and is then input to adder 118. The modulation is input to serial data port 115. Look-up read only memory (ROM) 119 traces out frequency versus time patterns dependent on the serial data stream received at port 115. The output of read only memory 119 is then input to adder 118.

The output of adder 118 is then used as the data input to accumulator 120. A cascade of accumulators (121, 122, and 123) along with recombination logic 124 form a time varying sequence which is added to the non-fractional part of the division in adder 126. The resulting sequence is then used to control divider 109. The divider control sequence results in effective division ratios which allow the synthesizer to realize fine frequency steps without excessive spurious content in the synthesizer output 138. The divider control sequence contains all information of channel setting, modulation, and automatic frequency control. (For a detailed explanation of this result see U.S. Pat. No. 5,093,632 entitled "Latched Accumulator Fractional N Synthesis with Residual Error Correction" authored by Hietala et al or U.S. Pat. No. 5,166,642 entitled "Multiple Accumulator Fractional N Synthesis with Series Recombination" authored by Hietala)

The output of divider 109 is used to provide the internal clock of a first fractional N synthesizer 140 consisting of accumulators 120, 121, 122, and 123, recombination logic 124 and look-up ROM 119. Additionally, the output of divider 109 is input to phase detector 110 where its phase is compared to that of reference oscillator 127. The output of phase detector 110 drives charge pump 111 which in turn drives the loop filter 112. The loop filter 112 develops a voltage to control the voltage sensitive port of variable oscillator 108. Finally, the output of variable oscillator 108 is used as the synthesizer output 138 and is provided to receiver 103 and transmitter 102 and also is provided to the input of divider 109 to complete the phase locked loop.

In the preferred embodiment, the automatic frequency control is provided to port 114 instead of directly to the reference oscillator 127. Thus, the accuracy of the reference oscillator 127 is maintained only by the stability of crystal 128. Any inaccuracy of crystal 128 due to temperature, make tolerance, or aging is compensated for by adjustment of the automatic frequency control data on port 114 so as to maintain the correct frequency at the synthesizer output 138.

In order to maintain a frequency of a reference clock 130 which is synchronized to the synthesizer output 138 for the control logic 104 and user interface 105 sections of the radiotelephone 101, a second fractional N synthesizer 139 is formed using accumulators 133, 134, 135, and 136, recombination logic 132, adder 131, and programmable divider 129. Programming data for this fractional N system is obtained from SPI data on port 114 and is converted to parallel form by latch 137.

The second fractional N synthesizer 139 is programmed based on the programming of the first fractional N synthesizer 140. This basis creates an accurate reference clock frequency 130 because the first fractional N synthesizer 140 determines the automatic frequency control offset necessary to adjust the first fractional N synthesizer 140 to the correct frequency at the synthesizer output 138, thus, the actual frequency of the free-running crystal oscillator 127 is implicitly known.

As an example, let the frequency at the synthesizer output 138 be $f_{VCO}$ and the total main loop division of divider 109 be $N_t$. Then the frequency of the free-running crystal 128 ($f_M$) may be determined as:

$$f_M = f_{VCO}/N_t$$

Now add a second divider 129 to the output of the free-running crystal oscillator 127 with division ratio equal to $N_2$. Then the frequency of the reference clock 130 can be expressed as:

$$f_R = f_M/N_2$$

Combine these two equations to obtain the frequency of the reference clock 130 only as a function of the synthesizer output 138.

$$f_R = f_{VCO}/(N_t * N_2)$$

For the GSM system the procedure to implement this is as follows:
1) Lock the radiotelephone 101 to any ARFCN. (Actual Radio Frequency Channel Number) This results in $f_{VCO}$: 890+0.2*(ARFCN) MHz
2) Next assume $f_R$: 200 kHz (for example) Then using the equation developed above for $f_R$.
0.2={890+0.2(ARFCN)}/($N_t * N_2$)
3) Solve for $N_2$.
$N_2 = 4450/N_t + ARFCN/N_t$
This initial programming will not change if the ARFCN is changed, since $N_t$ will change with ARFCN to maintain $N_2$ constant. The only situation in which $N_2$ will need to change is if $N_t$ is changed by the automatic frequency control algorithm. If the automatic frequency control algorithm requires a change, then $N_2$ could be recalculated using the above formula or by using a binomial expansion of the formula in 3) the following result is obtained.
$N_2 new = N_2 old (1 - \Delta N_t/N_t)$
In the above approximation $N_t$ is the value used to find $N_2 old$ and $\Delta N_t$=Numerator AFC/Denominator. Since $\Delta N_t < 10-5\ N_t$ this approximation will be highly accurate for the GSM system.

A second phase locked loop 141 may be added to an output of the reference clock 130 of FIG. 3. This second phase locked loop 141 may be used as a multiplier to increase the frequency of the reference clock 130.

What is claimed is:
1. An automatic frequency controlling device comprising:
a voltage controlled oscillator (VCO) having a control input and producing a frequency variable signal;
a first fractional N synthesizer for generating a first programmable value, at least a portion of the first programmable value having a non-integer value;
a first programmable divider for dividing said frequency variable signal by said first programmable value to produce a divided signal;
a reference oscillator generating a fixed frequency signal, substantially equal in frequency to said divided signal; and
a phase detector for comparing a phase of said fixed frequency signal to a phase of said divided signal, producing an output error signal having a voltage representing the difference in phase between said fixed frequency signal and said divided signal, said output error signal coupled to said control input of said VCO; and
a second fractional N synthesizer for generating a second programmable value, at least a portion of the second programmable value having a non-integer value; and a second programmable divider for dividing said fixed frequency signal by said second programmable value, producing a second fixed frequency signal.

2. An automatic frequency controlling device in accordance with claim 1 wherein said second fixed frequency signal is coupled to a reference input of a please locked loop (PLL).

3. An automatic frequency controlling device in accordance with claim 1 wherein said second fixed frequency signal is coupled to logic circuitry including a microprocessor.

4. An automatic frequency controlling device in accordance with claim 1 wherein said reference oscillator is a free running crystal oscillator.

5. An automatic frequency controlling device in accordance with claim 1 wherein said second programmable value is dependent upon said first programmable value.

6. A radiotelephone comprising:

a radio frequency (RF) transmitter for transmitting first data at a first frequency;

a RF receiver for receiving second data at a second frequency, the second data including automatic frequency control information;

a control logic for controlling the radiotelephone and providing automatic frequency control information, a first portion of the control logic operating at a third frequency; and a synthesizer comprising:

a voltage controlled oscillator (VCO) having a control input and producing a frequency variable signal, the frequency variable signal coupled to the RF transmitter and providing the first frequency during a first time period, coupled to the RF receiver and providing the second frequency during a second time period, a first fractional N synthesizer for generating a first programmable value dependent upon the automatic frequency control information, at least a portion of the first programmable value having a non-integer value;

a first divider for dividing said frequency variable signal by said first programmable value to produce a divided signal, a reference oscillator generating a first fixed frequency signal substantially equal in frequency to said divided signal, and a phase detector for comparing a phase of said first fixed frequency signal to a phase of said divided signal, producing an output error signal having a voltage representing the difference in phase between said first fixed frequency signal and said divided signal, said output error signal coupled to said control input of said VCO, a second fractional N synthesizer for generating a second programmable value, at least a portion of the second programmable value having a non-integer value, and a second divider for dividing said first fixed frequency signal by said second programmable value, producing a second fixed frequency signal having said third frequency.

7. A radiotelephone in accordance with claim 6 wherein said second fixed frequency signal is coupled to a reference input of a second phase locked loop (PLL), the second PLL providing a fourth frequency for operating a second portion of said control logic.

8. A radiotelephone in accordance with claim 6 wherein said second fixed frequency signal is used to operate a user interface.

9. A radiotelephone in accordance with claim 6 wherein said reference oscillator is a free running crystal oscillator.

10. A radiotelephone in accordance with claim 6 wherein said second programmable value is dependent upon said first programmable value.

* * * * *